United States Patent
Ishimatsu

(10) Patent No.: US 9,924,599 B2
(45) Date of Patent: Mar. 20, 2018

(54) ANISOTROPIC CONDUCTIVE FILM, ANISOTROPIC CONDUCTIVE FILM PRODUCTION METHOD, CONNECTING METHOD, AND BONDED STRUCTURE

(71) Applicant: DEXERIALS CORPORATION, Shinagawa-ku (JP)

(72) Inventor: Tomoyuki Ishimatsu, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 370 days.

(21) Appl. No.: 14/184,733

(22) Filed: Feb. 20, 2014

(65) Prior Publication Data

US 2014/0168919 A1    Jun. 19, 2014

Related U.S. Application Data

(63) Continuation of application No. PCT/JP2012/070138, filed on Aug. 8, 2012.

(30) Foreign Application Priority Data

Aug. 23, 2011    (JP) .................................. 2011-181695

(51) Int. Cl.
H05K 1/18 (2006.01)
H05K 13/04 (2006.01)
H01R 4/04 (2006.01)

(52) U.S. Cl.
CPC .............. *H05K 1/181* (2013.01); *H01R 4/04* (2013.01); *H05K 13/046* (2013.01); *Y10T 156/10* (2015.01); *Y10T 428/2991* (2015.01)

(58) Field of Classification Search
CPC ......... H01R 4/04; H05K 1/181; H05K 13/046

(Continued)

(56) References Cited

U.S. PATENT DOCUMENTS 4,740,657 A * 4/1988 Tsukagoshi .............. H01B 1/22
174/84 R
5,891,366 A * 4/1999 Gruenwald ................ C09J 9/02
156/272.8

(Continued)

FOREIGN PATENT DOCUMENTS

CN 101953026 A 1/2011
JP 63-237372 10/1988
(Continued)

OTHER PUBLICATIONS

Notice of Reasons for Rejection issued in corresponding Japanese application No. 2011-181695 dated Aug. 26, 2014.
(Continued)

*Primary Examiner* — William H Mayo, III
*Assistant Examiner* — Hiram E Gonzalez
(74) *Attorney, Agent, or Firm* — Buchanan, Ingersoll & Rooney PC

(57) ABSTRACT

To provide an anisotropic conductive film, which contains conductive particles, wherein the anisotropic conductive film is an anisotropic conductive film configured to anisotropic conductively connect a terminal of a substrate with a terminal of an electronic component, wherein the conductive particles are conductive particles, in each of which a metal plated layer and an insulating layer are sequentially provided on a surface of a resin particle, or conductive particles, in each of which an insulating layer is provided on a metal particle, or both thereof, and wherein 3.0 to 10.0 conductive particles are linked together on average.

16 Claims, 2 Drawing Sheets

(58) Field of Classification Search
USPC .............................. 361/760; 427/550; 156/60
See application file for complete search history.

(56) References Cited

U.S. PATENT DOCUMENTS

| | | | | |
|---|---|---|---|---|
| 5,965,064 | A * | 10/1999 | Yamada | C09J 9/02 174/259 |
| 7,535,624 | B2 * | 5/2009 | Amundson | C08K 3/22 345/107 |
| 8,133,412 | B2 * | 3/2012 | Yamamoto | C08L 71/00 252/500 |
| 9,226,406 | B2 * | 12/2015 | Yamamoto | C09J 9/02 |
| 2010/0051878 | A1 | 3/2010 | Akutsu et al. | |
| 2010/0219382 | A1 | 9/2010 | Abe | |
| 2010/0327232 | A1 | 12/2010 | Yamamoto et al. | |

FOREIGN PATENT DOCUMENTS

| | | |
|---|---|---|
| JP | 4-292803 | 10/1992 |
| JP | 2003-346556 A | 12/2003 |
| JP | 2004-185857 A | 7/2004 |
| JP | 2007-035490 | 2/2007 |
| JP | 2007-165028 A | 6/2007 |
| JP | 2008-269816 A | 11/2008 |
| JP | 2010-280871 A | 12/2010 |
| WO | WO 2009/054386 A1 | 4/2009 |

OTHER PUBLICATIONS

International Search Report (PCT/ISA/210) dated Oct. 30, 2012, by the Japanese Patent Office as the International Searching Authority for International Application No. PCT/JP2012/070138.

Written Opinion (PCT/ISA/237) dated Oct. 30, 2012, by the Japanese Patent Office as the International Searching Authority for International Application No. PCT/JP2012/070138.

Lin et al.: "Progress of Anisotropic Conductive Adhesive Interconnected Technology," Electronics & Packaging, vol. 6, No. 7, Jul. 31, 2006.

Office Action issued in corresponding Chinese Patent Application No. 201280040839.7 by the Chinese Patent Office dated Jul. 28, 2015 (26 pages including English Translation).

* cited by examiner

FIGS. 2A and 2B
2A
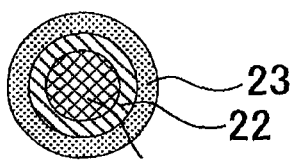
2B
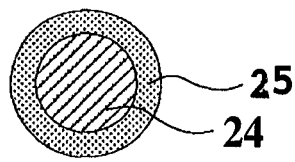
2A: (i) conductive particle
2B: (ii) conductive particles
21: resin particle
22: metal plated layer
23: insulating layer
24: metal particle
25: insulating layer
FIG. 3
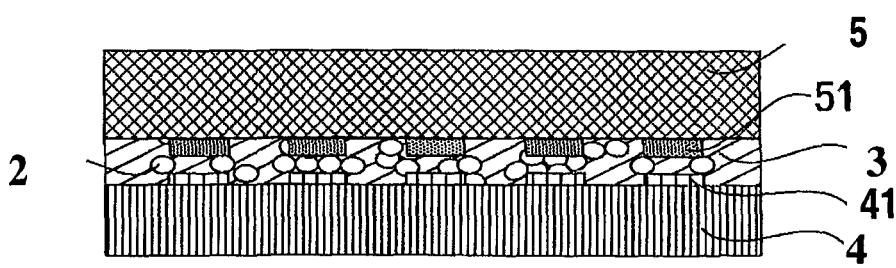
2: conductive particle
4: substrate
41: terminal
5: electronic component
51: terminal
100: bonded structure

ANISOTROPIC CONDUCTIVE FILM, ANISOTROPIC CONDUCTIVE FILM PRODUCTION METHOD, CONNECTING METHOD, AND BONDED STRUCTURE

CROSS-REFERENCE TO RELATED APPLICATION

This application is a continuation application of International Application PCT/JP2012/070138 filed on Aug. 8, 2012 and designated the U.S., the entire contents of which are incorporated herein by reference.

BACKGROUND OF THE INVENTION

Field of the Invention

The present invention relates to an anisotropic conductive film capable of electrically and mechanically connecting an electronic component, such as an IC chip, a liquid crystal display panel (LCD panel) of a liquid crystal display (LCD), and relates to a method for producing the anisotropic conductive film, a connection method and bonded structure using the anisotropic conductive film.

Description of the Related Art

Conventionally, a connecting material in the shape of a tape, obtained by coating a release film with a thermoset resin containing conductive particles dispersed therein (e.g., anisotropic conductive film (ACF; Anisotropic Conductive Film) has been used as means for connecting an electronic component with a substrate.

This anisotropic conductive film is used, for example, in a case where various terminals are bonded as well as electrically connected to each other, including when a terminal of a flexible print substrate (FPC) or IC chip is connected with an indium tin oxide (ITO) electrode formed on a glass substrate of a LCD panel.

Recently, an electronic component has been much downsized, and more integrated. Therefore, a pitch between adjacent electrode in the electronic component has been smaller (more fine-pitched). Most of electroconductive components used in an anisotropic conductive film are spherical, and those having diameters of several micrometers or larger are commonly used. When an electrode of an electronic component, which is downsized, integrated, and has a small pitch between electrode, is connected using the aforementioned anisotropic conductive film, there is a problem that insulation resistance between the adjacent electrodes (terminals) is not sufficient. Therefore, there is a need for achieving excellent conduction resistance, and insulating resistance between adjacent terminals in anisotropic conductive connection in a fine pitch.

As for a technique associated with a fine pitch, disclosed is an anisotropic conductive material, which can be used for connection between substrates and for a pressure sensitive sensor, and in which a metal powder composed of metal particles linked in the form of a chain is dispersed in a rubber material (see Japanese Patent Application Laid-Open (JP-A) No. 2003-346556).

In accordance with this technique, however, there is a problem that a short circuit is caused as particles of the metal powder are in contact with each other at the time of anisotropic conductive connection, and insulation resistance between adjacent electrode in a substrate or electronic component cannot be sufficiently maintained. Since a number of metal particles to be linked is not specified, moreover, there are particles in a chain, which do not effectively function for anisotropic conductive connection, and therefore a particle capturing rate tends to be low.

Moreover, disclosed is a connection method using an anisotropic conductive member, which contains: placing an isotropic conductive member containing conductive particles including a magnetic component, between two substrates on which a conductor pattern to be connected has been formed; applying a magnetic field to control an oriented state of the conductive particles; and heat bonding the two substrates (see JP-A No. 2004-185857).

In accordance with this technique, however, a magnetic field is applied during anisotropic conductive connection. Therefore, a large number of the conductive particles are linked in the form of a chain due to the applied magnetic field, As a result, insulation resistance between adjacent electrodes in a substrate or electronic component cannot be sufficiently maintained, and therefore there is a problem that a short circuit is caused. As a large number of the conductive particles are linked in the form of a chain, moreover, there are conductive particles in a chain, which do not effectively function for anisotropic conductive connection, and therefore a particle capturing rate tends to be low.

Accordingly, there are currently needs for an anisotropic conductive film, which can attain insulation resistance between adjacent terminals in anisotropic conductive connection of fine-pitch, and can achieve anisotropic conductive connection, which excels in conduction resistance and a particle capturing rate, as well as a method for producing the anisotropic conductive film, and a connecting method and bonded structure using the anisotropic conductive film.

SUMMARY OF THE INVENTION

The present invention aims to solve the aforementioned various problems in the art and achieve the following object. The object of the present invention is to provide an anisotropic conductive film, which can attain insulation resistance between adjacent terminals in anisotropic conductive connection of fine-pitch, and can achieve anisotropic conductive connection, which excels in conduction resistance and a particle capturing rate, as well as a method for producing the anisotropic conductive film, and a connecting method and bonded structure using the anisotropic conductive film.

The means for solving the aforementioned problems are as follows:

<1> An anisotropic conductive film, including:
conductive particles,
wherein the anisotropic conductive film is an anisotropic conductive film configured to anisotropic conductively connect a terminal of a substrate with a terminal of an electronic component,
wherein the conductive particles are conductive particles, in each of which a metal plated layer and an insulating layer are sequentially provided on a surface of a resin particle, or conductive particles, in each of which an insulating layer is provided on a metal particle, or both thereof, and
wherein 3.0 to 10.0 conductive particles are linked together on average.

<2> The anisotropic conductive film according to <1>, wherein the metal plated layer is a magnetic metal plated layer containing at least one selected from the group consisting of Fe, Ni, and Co.

<3> The anisotropic conductive film according to <1>, wherein the metal particle is a nickel particle.

<4> The anisotropic conductive film according to any one of <1> to <3>, wherein a particle linking rate of the conductive particles is 8% to 50%.
<5> A method for producing an anisotropic conductive film, including:
  magnetizing conductive particles having magnetism contained in an anisotropic conductive composition; and
  applying the anisotropic conductive composition containing the magnetized conductive particles onto a base,
  wherein the method is a method for producing the anisotropic conductive film according any one of <1> to <4>.
<6> A method for anisotropic conductively connecting a terminal of a substrate and a terminal of an electronic component, including:
  adhering an anisotropic conductive film on the terminal of the substrate;
  mounting the electronic component on the anisotropic conductive film; and
  heating and pressing the electronic component with a heat-press member,
  wherein the anisotropic conductive film is the anisotropic conductive film according to any one of <1> to <4>.
<7> A bonded structure obtained by the method according to <6>.

The present invention can solve the aforementioned various problems in the art, achieve the aforementioned object, and can provide an anisotropic conductive film, which can attain insulation resistance between adjacent terminals in anisotropic conductive connection of fine-pitch, and can achieve anisotropic conductive connection, which excels in conduction resistance and a particle capturing rate, as well as a method for producing the anisotropic conductive film, and a connecting method and bonded structure using the anisotropic conductive film.

BRIEF DESCRIPTION OF THE DRAWING

FIGS. 2A and 2B are schematic cross-sectional views illustrating two embodiments of conductive particles.
FIG. 3 is a schematic cross-sectional view illustrating an embodiment of a bonded structure.

Figure 1:
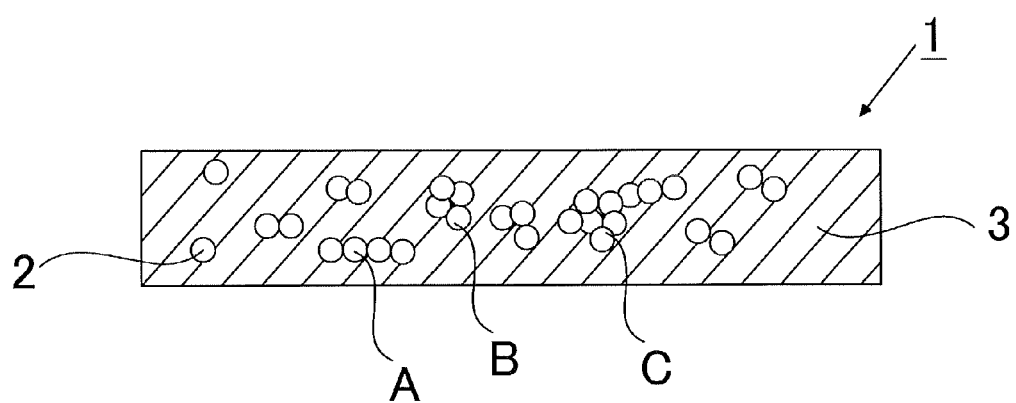
FIG. 1 is a schematic cross-sectional view illustrating one example of the anisotropic conductive film of the present invention.

DETAILED DESCRIPTION OF THE INVENTION (Anisotropic Conductive Film)
The anisotropic conductive film of the present invention is an anisotropic conductive film, which is configured to anisotropic conductively connect a terminal of a substrate with a terminal of an electronic component. The anisotropic conductive film of the present invention contains conductive particles, and may further contain other components according to the necessity.
<Conductive Particles>
The conductive particles are conductive particles, in each of which a metal plated layer and an insulating layer are sequentially provided on a surface of a resin particle, or conductive particles, in each of which an insulating layer is provided on a metal particle, or both thereof.
Shapes and sizes of the conductive particles are appropriately selected depending on the intended purpose without any limitation.

—Resin Particle(s)—
A material of the resin particle is appropriately selected depending on the intended purpose without any limitation, and examples thereof include polyethylene, polypropylene, polystyrene, polyvinyl chloride, polyvinylidene chloride, polytetrafluoroethylene, polyisobutylene, polybutadiene, polyalkyl terephthalate, polysulfone, polycarbonate, polyamide, a phenol formaldehyde resin, a melamine formaldehyde resin, a benzoguanamine formaldehyde resin, a urea formaldehyde resin, (meth)acrylate polymer, divinyl benzene polymer, and divinyl benzene-based copolymer. These may be used independently, or in combination.

Among them, preferred are (meth)acrylate polymer, divinyl benzene polymer, and divinyl benzene-based copolymer.
Examples of the divinyl benzene-based copolymer include divinylbenzene-styrene copolymer, and divinylbenzene-(meth)acrylate copolymer.

In the present specification, (meth)acrylate denotes either methacrylate or acrylate. The (meth)acrylate polymer may be a cross-linked (meth)acrylate polymer or a non-cross-linked polymer, or a mixture thereof.

A shape of the resin particle is appropriately selected depending on the intended purpose without any limitation, but a surface thereof has fine irregularities.

A structure of the resin particle is appropriately selected depending on the intended purpose without any limitation, and examples thereof include a single layer structure, and a multi-layer structure.

The average particle diameter of the resin particles is appropriately selected depending on the intended purpose without any limitation, but the average particle diameter thereof is preferably 1 µm to 50 µm, more preferably 2 µm to 20 µm, and particularly preferably 2 µm to 10 µm.

When the average particle diameter of the resin particles is smaller than 1 µm, or greater than 50 µm, a sharp particle size distribution may not be attained. When the average particle diameter of the resin particles is within the aforementioned particularly preferable range, it is advantageous because excellent connection reliability can be attained.

Note that, the average particle diameter of the resin particles can be measured, for example, by means of a particle size distribution analyzer (MICTOTRAC MT3100, manufactured by NIKKISO CO., LTD.).

—Metal Plated Layer—
The metal plated layer is appropriately selected depending on the intended purpose without any limitation, provided that it is a plated layer formed on each surface of the resin particles. The metal plated layer is preferably a magnetic plated layer containing at least one selected from Fe, Ni, and Co in view of high magnetism and obtainable high particle linking rate, more preferably a magnetic metal plated layer containing Ni.

The metal plated layer may contain phosphorus, or boron, or both thereof.

A concentration of phosphorus in the metal plated layer is appropriately selected depending on the intended purpose without any limitation, but the concentration thereof is preferably 10% by mass or less, more preferably 3.0% by mass to 10% by mass. When the concentration of phosphorus is greater than 10% by mass, the particle linking rate, number of captured particles, and particle capturing rate (particle capturing efficiency rate) may be degraded.

A concentration of boron in the metal plated layer is appropriately selected depending on the intended purpose without any limitation.

A method for adjusting the concentration of phosphorus and the concentration of boron in the metal plated layer is appropriately selected depending on the intended purpose without any limitation, and examples thereof include: a method, in which pH of a plating reaction is controlled; and a method, in which a concentration of phosphoric acid and concentration of boron in a plating solution are controlled.

Among them, the method for controlling pH of the plating reaction is preferable as it achieves excellent control in a reaction.

Note that, the concentration of phosphorus and concentration of boron can be measured, for example, by performing a composite analysis on the plated layer using EDX (energy-dispersive X-ray spectrometer, manufactured by Hitachi High-Technologies Corporation).

Examples of the plating include Ni—P (nickel-phosphorus) plating, Ni—B (nickel-boron) plating, Fe plating, and Co plating.

The average thickness of the metal plated layer is appropriately selected depending on the intended purpose without any limitation, but the average thickness thereof is preferably 10 nm to 200 nm.

When the average thickness thereof is greater than 200 nm, plated particles tend to be aggregated to each other due to the plating, to thereby form significantly large particles.

Note that, the average thickness of the metal plated layer is a thickness obtained by randomly selecting 10 particles, polishing cross-sections thereof, for example, by means of a focused ion beam system (product name: FB-2100, manufactured by Hitachi High-Technologies Corporation), measuring a thickness of each metal plated layer by means of a transmission electron microscope (product name: H-9500, manufactured by Hitachi High-Technologies Corporation), and calculating the arithmetic means of the measured values.

A plating method for forming the metal plated layer is appropriately selected depending on the intended purpose without any limitation, and examples thereof include electroless plating, and sputtering.

—Metal Particle(s)—

The metal particles are appropriately selected depending on the intended purpose without any limitation, and examples thereof include various metal powders, and alloy powders thereof, such as copper, iron, nickel, gold, silver, aluminum, zinc, stainless steel, hematite ($Fe_2O_3$), magnetite ($Fe_3O_4$), various ferrite represented by the following general formulae: $MFe_2O_4$, $MO.nFe_2O_3$ (where M is a divalent metal (e.g., Mn, Co, Ni, Cu, Zn, Ba, and Mg), n is a positive integer, and each of M may be the same or different, as repeated), Si-steel powder, permalloy, Co-group amorphous alloy, Sendust, alperm, supermalloy, mu-metal, permendur, and perminvar. These may be used independently, or in combination. Among them, nickel particles are preferable in view of connection reliability.

—Insulating Layer—

The insulating layer is appropriately selected depending on the intended purpose without any limitation, and examples thereof include a layer formed of a resin. The resin is appropriately selected depending on the intended purpose without any limitation, and examples thereof include a solid epoxy resin, a phenoxy resin, a vinyl polymer, a polyester resin, an alkylated cellulose resin, and a flux resin.

A method for coating the resin particles on each surface of which the metal plated layer has been provided, or the metal particles with the insulating layer is appropriately selected depending on the intended purpose without any limitation. Examples thereof include a method containing dispersing resin particles to each of which a metal plated layer has been provided, or metal particles in a resin solution to prepare a dispersion liquid, and spraying the dispersion liquid as fine droplets with heating to dry the solvent. A resin used for this method is appropriately selected depending on the intended purpose without any limitation, and examples thereof include a solid epoxy resin, a phenoxy resin, a vinyl polymer, a polyester resin, an alkylated cellulose resin, and a flux resin.

The average particle diameter of the conductive particles is appropriately selected depending on the intended purpose without any limitation, but the average particle diameter thereof is preferably 1 μm to 50 μm, more preferably 2 μm to 10 μm. When the average particle diameter is smaller than 1 μm, a function as conductive particles is not exhibited, and therefore conduction failures may be caused. When the average particle diameter thereof is greater than 50 μm, film forming ability is low, and therefore a problem may be caused during the production.

Note that, the average particle diameter of the conductive particles can be measured, for example, by means of a particle size distribution analyzer (MICTOTRAC MT3100, manufactured by NIKKISO CO., LTD.).

The conductive particles (3.0 to 10.0 on average) are linked in the anisotropic conductive film, preferably 3.0 to 5.0 of the conductive particles are linked on average. When the average particle number of the linkage is less than 3.0, a particle capturing rate is low. When the average particle number thereof is greater than 10.0, press during pressure bonding is impaired and therefore conduction failures may be caused.

The linkage of the conductive particles means a state that the conductive particles are in contact with each other. A method for linking the conductive particles is appropriately selected depending on the intended purpose without any limitation, but it is preferably the magnetizing step in the method for producing an isotropic conductive film of the present invention, which is described later.

The average particle number of the linkage can be measured by the following method. The anisotropic conductive film is observed under a metallurgical microscope (product name: MX51, manufactured by Olympus Corporation), and a number of particle groups where particles are linked are counted with respect to the observed 1,000 conductive particles. Then, a value obtained by [1,000/(number of particle groups where particles are linked)] is determined as the average number.

A state where the conductive particles are linked in the anisotropic conductive film is explained with reference to FIG. 1. FIG. 1 is a schematic cross-sectional view illustrating one example of the anisotropic conductive film of the present invention. The anisotropic conductive film 1 contains conductive particles 2, and a resin layer 3 containing a film-forming resin. In FIG. 1, the number of the linked particles in the particle group A, in which four conductive particles are linearly aligned and in contact with each other, is 4. The number of the linked particles in the particle group B, in which four conductive particles are aggregated and in contact with each other, is 4. The number of the linked particles in the particle group C, in which nine conductive particles are partially linearly aligned, and partially aggregated, as well as being in contact with each other, is 9. An embodiment of linkage is preferably a particle group where conductive particles are aggregated and in contact with each other, in view of an improvement in a particle capturing rate.

The particle linking rate of the conductive particles is appropriately selected depending on the intended purpose without any limitation, but the particle linking rate thereof is preferably 8% to 80%, more preferably 8% to 50%, and particularly preferably 30% to 50%. When the particle linking rate thereof is less than 8%, an improvement in a particle capturing rate may not be sufficient. When particle linking rate thereof is greater than 80%, a particle capturing rate may be low, and there may be the conductive particles that are not captured.

The particle linking rate (%) can be determined in the following manner. The number of the conductive particles per 1 mm$^2$ of the anisotropic conductive film [particle concentration (A) (number/mm$^2$)], and the particle concentration (B) (number/mm$^2$), where the number of the linked particles was 2 or less (the number of the conductive particles that were not linked with other conductive particles, and the conductive particles in the particles group whose number of the linked conductive particles was 2, per 1 mm$^2$ of the anisotropic conductive film), are counted. The particle linking rate (%) is determined based on the obtained values using the following equation (1). The particle concentration (area density) can be determined, for example, by means of a metallurgical microscope (product name: MX51, manufactured by Olympus Corporation).

Particle linking rate (%)=[1−(particle concentration ($B$) of two or less linked particles/particle concentration ($A$))]×100    Equation (1)

In the equation (1) above, the number of the particles, where the two conductive particles are linked, is counted as two.

An amount of the conductive particles in the anisotropic conductive film is appropriately selected depending on the intended purpose without any limitation.

<Other Components>

Other components are appropriately selected depending on the intended purpose without any limitation, and examples thereof include a film-forming resin, thermoset resin, curing agent, and a silane coupling agent.

—Film-Forming Resin—

The film-forming resin is appropriately selected depending on the intended purpose without any limitation, and examples thereof include a phenoxy resin, an unsaturated polyester resin, a saturated polyester resin, a urethane resin, a butadiene resin, a polyimide resin, a polyamide resin, and a polyolefin resin. The film-forming resin may be used independently, or in combination. Among them, a phenoxy resin is particularly preferable because of its film forming properties, processability, and connection reliability.

The phenoxy resin is a resin synthesized from bisphenol A and epichlorohydrin. The phenoxy resin may be appropriately synthesized for use, or selected from commercial products thereof.

An amount of the film-forming resin in the anisotropic conductive film is appropriately selected depending on the intended purpose without any limitation.

—Thermoset Resin—

The thermoset resin is appropriately selected depending on the intended purpose without any limitation, and examples thereof include an epoxy resin, and acrylic resin.

——Epoxy Resin——

The epoxy resin is appropriately selected depending on the intended purpose without any limitation, and examples thereof include a thermoset epoxy resin, such as a bisphenol A epoxy resin, a bisphenol F epoxy resin, a novolak epoxy resin, and modified epoxy resins thereof. These may be used independently, or in combination.

An amount of the epoxy resin in the anisotropic conductive film is appropriately selected depending on the intended purpose without any limitation.

——Acrylic Resin——

The acrylic resin is appropriately selected depending on the intended purpose without any limitation, and examples thereof include methyl acrylate, ethyl acrylate, isopropyl acrylate, isobutyl acrylate, phosphoric acid group-containing acrylate, ethylene glycol diacrylate, diethylene glycol diacrylate, trimethylol propane triacrylate, dimethylol tricyclodecane diacrylate, tetramethylene glycol tetraacrylate, 2-hydroxy-1,3-diacryloxypropane, 2,2-bis[4-(acryloxymethoxy)phenyl]propane, 2,2-bis[4-(acryloxyethoxy)phenyl]propane, dicyclopentenyl acrylate, tricyclodecanyl acrylate, tris(acryloxyethyl)isocyanurate, urethane acrylate, and epoxy acrylate. Note that, methacrylates where the aforementioned acrylates are replaced with methacrylates may also be used as the acrylic resin. These may be used independently, or in combination.

An amount of the acrylic resin in the anisotropic conductive film is appropriately selected depending on the intended purpose without any limitation.

—Curing Agent—

The curing agent is appropriately selected depending on the intended purpose without any limitation, and examples thereof include a cationic curing agent, an anionic curing agent, and a radical curing agent.

——Cationic Curing Agent——

The cationic curing agent is appropriately selected depending on the intended purpose without any limitation, and examples thereof include a sulfonium salt, and an onium salt. Among them, an aromatic sulfonium salt is preferable.

The cationic curing agent is preferably used in combination with an epoxy resin serving as the thermoset resin.

An amount of the cationic curing agent in the anisotropic conductive film is appropriately selected depending on the intended purpose without any limitation.

——Anionic Curing Agent——

The anionic curing agent is appropriately selected depending on the intended purpose without any limitation, and examples thereof include polyamine.

The anionic curing agent is preferably used in combination with an epoxy resin serving as the thermoset resin.

An amount of the anionic curing agent in the anisotropic conductive film is appropriately selected depending on the intended purpose without any limitation.

——Radical Curing Agent——

The radical curing agent is appropriately selected depending on the intended purpose without any limitation, and examples thereof include organic peroxide.

The radical curing agent is preferably used in combination with an acrylic resin serving as the thermoset resin.

An amount of the radical curing agent in the anisotropic conductive film is appropriately selected depending on the intended purpose without any limitation.

—Silane Coupling Agent—

The silane coupling agent is appropriately selected depending on the intended purpose without any limitation, and examples thereof include an epoxy-based silane coupling agent, an acryl-based silane coupling agent, a thiol-based silane coupling agent, and an amine-based silane coupling agent.

An amount of the silane coupling agent in the anisotropic conductive film is appropriately selected depending on the intended purpose without any limitation.

A thickness of the anisotropic conductive film is appropriately selected depending on the intended purpose without any limitation.

(Method for Producing Anisotropic Conductive Film)

The method for producing an anisotropic conductive film of the present invention is a production method of the anisotropic conductive film of the present invention, and contains at least a magnetizing step, and an applying step, and may further contain other steps according to the necessity.

<Magnetizing Step>

The magnetizing step is appropriately selected depending on the intended purpose without any limitation, provided that it is magnetizing the conductive particles having magnetism contained in the anisotropic conductive composition.

The conductive particles are the conductive particles in the anisotropic conductive film of the present invention.

The anisotropic conductive composition is appropriately selected depending on the intended purpose without any limitation, provided that the anisotropic conductive composition contains the conductive particles. For example, the anisotropic conductive composition is an anisotropic conductive composition contains at least the conductive particles, preferably further contains a film-forming resin, a thermoset composition, and a curing agent.

The film-forming resin in the anisotropic conductive composition is appropriately selected depending on the intended purpose without any limitation, and examples thereof include the film-forming resins listed in the description of the anisotropic conductive film of the present invention.

The thermoset resin in the anisotropic conductive composition is appropriately selected depending on the intended purpose without any limitation, and examples thereof include the thermoset resin listed in the description of the anisotropic conductive film of the present invention.

The curing agent in the anisotropic conductive composition is appropriately selected depending on the intended purpose without any limitation, and examples thereof include the curing agents listed in the description of the anisotropic conductive film of the present invention.

A method for magnetizing the conductive particles is appropriately selected depending on the intended purpose without any limitation, and examples thereof include a method for magnetizing using a pulse magnetizing device.

The conditions for the magnetizing are appropriately selected depending on the intended purpose without any limitation, provided that they are the conditions that 3.0 to 10.0 conductive particles are linked on average in a resulting anisotropic conductive film.

<Applying Step>

The applying step is appropriately selected depending on the intended purpose without any limitation, provided that it is applying the anisotropic conductive composition containing the magnetized conductive particles onto a base.

A material of the base is appropriately selected depending on the intended purpose without any limitation, but the material thereof is preferably a polyethylene terephthalate film. Note that, the polyethylene terephthalate film may contain inorganic fillers, such as titanium oxide, for the purpose of enhancing a strength thereof.

The average thickness of the base is appropriately selected depending on the intended purpose without any limitation, but the average thickness thereof is preferably 10 µm to 80 µm, more preferably 12 µm to 75 µm.

When the average thickness of the base is less than 10 µm, tensile strength is low and therefore it is difficult to handle a resulting anisotropic conductive film during assembling. When the average thickness thereof is greater than 80 µm, it is difficult to turn a resulting anisotropic conductive film into a form of a real, and an amount of a waste material increases as a base is disposed in the end.

A release treatment, such as a silicone treatment, may be optionally performed on the base.

The application method is appropriately selected depending on the intended purpose without any limitation, and examples thereof include: various coating methods, such as blade coating, spray coating, spin coating, and roller coating; a hot melt method; and a co-extrusion method.

At the time of the application, heating may be optionally performed. The temperature and duration of the heating are appropriately selected depending on the intended purpose without any limitation.

(Connecting Method and Bonded Structure)

The connecting method of the present invention contains at least an adhering step, a mounting step, and a heat-press step, and may further contain other steps according to the necessity.

The connecting method is a method for anisotropic conductively connecting a terminal of a substrate with a terminal of an electronic component.

The bonded structure of the present invention is produced by the connecting method of the present invention.

<Substrate>

The substrate is appropriately selected depending on the intended purpose without any limitation, provided that the substrate is a substrate having a terminal, which is a target of anisotropic conductive connection. Examples of the substrate include an ITO glass substrate, a flexible substrate, and a rigid substrate.

A size, shape, and structure of the substrate are appropriately selected depending on the intended purpose without any limitation.

<Electronic Component>

The electronic component is appropriately selected depending on the intended purpose without any limitation, provided that it is an electronic component having a terminal, which is to be a target of anisotropic conductive connection. Examples thereof include an IC chip, a TAB tape, and a liquid crystal panel. Examples of the IC chip include an IC chip for controlling liquid crystal display in a flat panel display (FPD).

<Adhering Step>

The adhering step is appropriately selected depending on the intended purpose without any limitation, provided that it is adhering an anisotropic conductive film onto a terminal of the substrate.

The anisotropic conductive film is the anisotropic conductive film of the present invention.

<Mounting Step>

The mounting step is appropriately selected depending on the intended purpose without any limitation, provided that it is mounting the electronic component on the anisotropic conductive film.

Typically, anisotropic conductive connection is not achieved in the mounting step.

<Heat-Press Step>

The heat-press step is appropriately selected depending on the intended purpose without any limitation, provided that it is heating and pressing the electronic component with a heat-press member.

Examples of the heat-press member include a press member equipped with a heating system. Examples of the press member equipped with a heating system include a heat tool.

The temperature for the heating is appropriately selected depending on the intended purpose without any limitation, and it is, for example, in the range of 100° C. to 250° C.

The pressure for the pressing is appropriately selected depending on the intended purpose without any limitation, and it is, for example, in the range of 0.1 MPa to 100 MPa.

The duration of the heating and pressing is appropriately selected depending on the intended purpose without any limitation, and it is, for example, in the range of 0.5 seconds to 120 seconds.

It is preferred that, in the heat-press step, the anisotropic conductive film be softened, and then cured.

By applying heat and pressure in the heat-press step, the conductive particles present between a terminal of the substrate and a terminal of the electronic component are deformed with pressure applied between the terminal. The insulating layer of each conductive particle are cracked due to the aforementioned deformation, to thereby expose the metal plated layer of metal particle of the conductive particle. As the metal plated layer or metal particle of the conductive particle is exposed, a terminal of the substrate and a terminal of the electronic component can be electrically connected to each other via the conductive particles, to thereby achieve anisotropic conductive connection.

In this case, by linking 3.0 to 10.0 of the conductive particles on average, a particle capturing rate is improved, and excellent anisotropic conductive connection is realized.

Moreover, the conductive particles present between the terminals of the substrate, or between the terminals of the electronic component are hardly deformed even when the anisotropic conductive film is heated and pressed. Therefore, the conductive particles present between the terminals of the substrate, or between the terminals of the electronic component are remained in the state where the metal plated layer or metal particle is covered with the insulating layer without being exposed. As a result, insulation resistance between the terminals of the substrate or between the terminals of the electronic component is maintained even in the case where the conductive particles are bound to cover the space between the terminals of the substrate or between the terminals of the electronic component. Therefore, a short circuit can be prevented.

EXAMPLES

Examples of the present invention are explained hereinafter, but Examples shall not be construed as to limit a scope of the present invention in any way. Note that, "part(s)" in the description below denotes "part(s) by mass" unless otherwise stated.

Production Example 1

<Production of Crosslinked Polystyrene Particles>

To a solution, in which a blending ratio of divinyl benzene, styrene, and butyl methacrylate was adjusted, benzoyl peroxide was added as a polymerization initiator, and the resultant was homogeneously stirred at high speed with heating to proceed to a polymerization reaction, to thereby obtain a particle dispersion liquid. The particle dispersion liquid was filtered, followed by vacuum dried, to thereby obtain a block product that was an aggregated product of the particles. Then, the block product was pulverized, to thereby obtain crosslinked polystyrene particles having the average particle diameter of 3 μm.

Comparative Example 1

<Production of Anisotropic Conductive Film>
—Preparation of Anisotropic Conductive Composition—

In a mixture containing 50 parts of a microcapsule amine-based curing agent (product name: NOVACURE HX3941HP, manufactured by Asahi Kasei E-materials Corporation), 14 parts of a liquid epoxy resin (product name: EP828, manufactured by Mitsubishi Chemical Corporation), 35 parts of a phenoxy resin (product name: YP50, manufactured by NIPPON STEEL & SUMIKIN CHEMICAL CO., LTD.), and 1 part of a silane coupling agent (product name: KBE403, manufactured by Shin-Etsu Chemical Co., Ltd.), conductive particles having the average particle diameter of 3 μm, which had been obtained by sequentially performing Ni plating and Au plating on the crosslinked polystyrene particles having the average particle diameter of 3 μm obtained in Production Example 1, were dispersed to give a particle concentration of 4,000 pcs·(number)/mm$^2$, to thereby obtain Anisotropic Conductive Composition 1.

Note that, the average thickness of a total plated layer including Ni plating and Au plating was 100 nm.

The average thickness of the plated layer was a thickness determined in the following manner. Ten particles were randomly selected, and cross-sections thereof were polished by means of a focused ion beam system (product name: FB-2100, manufactured by Hitachi High-Technologies Corporation), and a thickness of each plated layer was measured by means of a transmission electron microscope (product name: H-9500, manufactured by Hitachi High-Technologies Corporation). The arithmetic mean of the measured values was calculated and determined as the average thickness of the plated layer.

—Magnetizing Step—

By means of a cylindrical pulse magnetizing device (P-2804, manufactured by Magnetlabo K.K.), magnetizing electric current of 1,000 A was applied to Anisotropic Conductive Composition 1 with interval of 3 seconds, to thereby perform magnetization for 15 seconds. In this manner, the conductive particles in Anisotropic Conductive Composition 1 were magnetized.

—Production of Anisotropic Conductive Film—

Anisotropic Conductive Composition 1 containing the magnetized conductive particles was applied onto a release polyethylene terephthalate (PET) film, which had been treated with silicone, so that the average thickness after being dried was to be 20 μm. In this manner, Anisotropic Conductive Film 1 in the form of a sheet was obtained.

<Connecting Method (Production of Bonded Structure)>

As for an evaluation base, COF (a base for evaluation, 35 μm-pitch, line/space=1/1, Cu (8 μm-thick)-Sn plated, 38 μm-thick S'perflex base) and an ITO coating glass (a base for evaluation, 35 μm-pitch, glass thickness: 0.7 mm) were used, and then anisotropic conductive connection was performed.

Specifically, Anisotropic Conductive Film 1 as produced above was slit into a width of 1.0 mm. Anisotropic Conductive Film 1, which had been slit, was bonded to the ITO coating glass.

The COF was placed thereon and positioned, followed by temporally fixing the COF thereon. The resulting laminate was bonded using a heat tool having a width of 1.0 mm, and a buffer material (TEFLON (registered trade mark) having a thickness of 70 μm) to perform anisotropic conductive connection under the pressure bonding conditions of 190°

C., 3 MPa, for 10 seconds (tool speed: 10 mm/sec, stage temperature: 40° C.), to thereby produce Bonded Structure 1.

<Evaluation>

The produced anisotropic conductive film and bonded structure were subjected to the following evaluations. The results are presented in Table 1-1.

[Average Particle Number of Linkage]

The average particle number of linkage of the conductive particles in the anisotropic conductive film was determined in the following manner. The anisotropic conductive film was observed under a metallurgical microscope (product name: MX51, manufactured by Olympus Corporation). The number of the linked particle groups relative to 1,000 conductive particles observed was counted, and the value of [1,000 particles/(the number of the groups of linked particles)] was determined as the average particle number of the linkage.

[Particle Linking Rate]

The particle linking rate (%) was determined in the following manner. The number of the conductive particles per 1 mm$^2$ of the anisotropic conductive film [particle concentration (A)(number/mm$^2$)], and the particle concentration (B) (number/mm$^2$), where the number of the linked particles was 2 or less (the number of the conductive particles that were not linked with other conductive particles, and the conductive particles in the particles group whose number of the linked conductive particles was 2, per 1 mm$^2$ of the anisotropic conductive film), were counted, based upon which the particle linking rate (%) was determined using the following equation (1).

Particle linking rate (%)=[1−(particle concentration ($B$) of two or less linked particles/particle concentration ($A$))]×100    Equation (1)

In the equation (1) above, the number of the particles, where the two conductive particles were linked, was counted as two.

[Captured Particle Number, and Particle Capturing Rate (Particle Capturing Efficiency Rate)]

The captured particle number and particle capturing rate (particle capturing efficiency rate) were measured in the following manner.

The number of the conductive particles on 100 terminals in each bonded structure (number of particles after the connection) was counted under a metallurgical microscope (product name: MX51, manufactured by Olympus Corporation).

The maximum value, and minimum value of the particle number per terminal were determined. Moreover, the average value thereof was determined as the captured particle number.

Further, the particle capturing rate (particle capturing efficiency rate) per terminal was determined from the following equation (2).

Particle capturing efficiency rate (%)=[(number of captured particles after pressure bonding)/(number of particles present below a terminal before pressure bonding)]×100    Equation (2)

Note that, [number of captured particles after pressure bonding] is a number of the conductive particles, which are clearly judged as being on the terminal and being associated with connection, and [number of particles present below a terminal before pressure bonding] is, in other words, a number of the conductive particles present in the same area to the terminal in the anisotropic conductive film before pressure bonding.

[Resistance]

The resistance (Ω) between terminals in each bonded structure was measured at 15 positions by applying electric current of 1 mA in accordance with a 4-terminal method. In this measurement, the maximum value, minimum value, and average value of the measured values were determined.

[Occurrence of Short Circuit]

The insulation resistance of each bonded structure when voltage of 30 V was applied between terminals was measured. In the measurement, a case where the insulation resistance was less than 1×10$^8$Ω was judged as short circuit. The measurement was performed on 30 positions between the terminals, and the number of occurrences of short circuit was determined.

Comparative Example 2

<Production of Anisotropic Conductive Film and Bonded Structure>

Anisotropic Conductive Film 2 in the form of a sheet was obtained in the same manner as in Comparative Example 1, provided that Ni plating and Au plating were replaced with only Ni—P (nickel-phosphorus) plating.

Moreover, Bonded Structure 2 was produced in the same manner as in Comparative Example 1.

—Ni—P Plating—

The crosslinked polystyrene particles (10 g) having the average particle diameter of 3 mm obtained in Production Example 1 were subjected to alkali etching with a 5% by mass sodium hydroxide aqueous solution, followed by acid neutralization. The resultant was then subjected to sensitization with a tin (II) chloride solution. Thereafter, the resultant was subjected to a pretreatment of electroless plating, which was activation in a palladium (II) chloride solution, followed by washing through filtration, to thereby obtain conductive particles to each surface of which palladium had been deposited.

To obtained conductive particles, 1,500 mL of water was added. To the resultant, 0.005 mmol of bismuth nitrate, and 0.006 mmol of thallium nitrate were added as plating stabilizers. The pH of the resultant was adjusted to 5.7 with a 10% by mass sulfuric acid aqueous solution and a sodium hydroxide (2N) aqueous solution, to thereby prepare slurry. The temperature of the slurry was set to 26° C.

To the slurry, a first-half reaction plating liquid, which contained 40 mL of nickel sulfate (450 g/L), 80 mL of a mixed solution of sodium hypophosphite (150 g/L) and sodium citrate (116 g/L), 280 mL of water, and as plating stabilizers, 0.02 mmol of bismuth nitrate, and 0.024 mmol of thallium nitrate, and the pH of which had been adjusted to 9.3 with 28% by mass ammonia water, was added by a metering pump at the constant feeding rate of 80 mL/min.

Thereafter, the resulting liquid was stirred until the pH was stabilized. After confirming that bubbling of hydrogen was stopped, a first-half process of electroless plating was carried out.

Subsequently, a second-half reaction plating liquid, which contained 180 mL of nickel sulfate (450 g/L), 440 mL of a mixed solution of sodium hypophosphite (150 g/L) and sodium citrate (116 g/L), and as plating stabilizers, 0.3 mmol of bismuth nitrate, and 0.36 mmol of thallium nitrate, was added by the metering pump at a feeding rate of 27 mL/min.

Thereafter, the resulting liquid was stirred until the pH was stabilized. After confirming that bubbling of hydrogen was stopped, a second-half process of electroless plating was carried out.

Subsequently, the plating liquid was filtered, and the filtered product was washed with water, followed by dried in a vacuum drier of 80° C., to thereby obtain conductive particles each having a Ni—P plating layer.

The obtained anisotropic conductive film and bonded structure was subjected to the evaluations in the same manner as in Comparative Example 1. The results are presented in Table 1-1.

Note that, the average thickness of the plated layer was 100 nm, and a concentration of phosphorus (P) in the plated layer of the conductive particle was 9.5% by mass.

Note that, the concentration of P, and a concentration of boron (B) described below were measured by cutting out the cross-section of the plated particle by means of a focused ion beam system (manufactured by Hitachi High-Technologies Corporation), and performing a component analysis of the plated layer by EDX (energy-dispersive X-ray spectrometer, manufactured by Hitachi High-Technologies Corporation).

Example 1

<Production of Anisotropic Conductive Film and Bonded Structure>
—Production of Conductive Particles 1—

Resin particles, to each of which a metal plated layer was provided, were obtained in the same manner as in Comparative Example 2, provided that the concentration of P in the Ni—P (nickel-phosphorus) plating was changed to the concentration of P depicted in Table 1-1.

Subsequently, the resin particles, to each of which the metal plated layer had been provided, were covered with an insulating layer in accordance with the method described in the paragraphs [0013] to [0014] in JP-S No. 04-362104. Moreover, whether or not each of the resin particles each provided with the metal plated layer were covered with the insulating layer was confirmed by observing the particles under the metallurgical microscope
<Production of Anisotropic Conductive Film and Bonded Structure>

Anisotropic Conductive Film 3 and Bonded Structure 3 were obtained in the same manner as in Comparative Example 1, provided that the conductive particles were replaced with Conductive Particles 1.

Anisotropic Conductive Film 3 and Bonded Structure 3 as obtained were subjected to the evaluations in the same manner as in Comparative Example 1. The results are presented in Table 1-1.

Examples 2 and 3

<Production of Anisotropic Conductive Film and Bonded Structure>

Anisotropic Conductive Films 4 to 5, and Bonded Structures 4 to 5 were obtained in the same manner as in Example 1, provided that, in the production of the conductive particles, the concentration of P in the Ni—P plating was changed to the concentration of P depicted in Table 1-1.

Note that, the average thickness of the plated layer was 100 nm in both Examples 2 and 3. Moreover, whether or not each of the resin particles each provided with the metal plated layer were covered with the insulating layer was confirmed by observing the particles under the metallurgical microscope Anisotropic Conductive Films 4 to 5 and Bonded Structures 4 to 5 as obtained were subjected to the evaluations in the same manner as in Comparative Example 1. The results are presented in Table 1-1.

Example 4

<Production of Anisotropic Conductive Film and Bonded Structure>

Anisotropic Conductive Film 6 and Bonded Structure 6 are obtained in the same manner as in Example 1, provided that, in the production of the conductive particles, Ni—P plating was changed to Ni—B (nickel-boron) plating, and the concentration of B (boron) in the plated layer was changed to 5.5% by mass.

Note that, the average thickness of the plated layer was 100 nm. Moreover, whether or not each of the resin particles each provided with the metal plated layer were covered with the insulating layer was confirmed by observing the particles under the metallurgical microscope.

Anisotropic Conductive Film 6 and Bonded Structure 6 as obtained were subjected to the evaluations in the same manner as in Comparative Example 1. The results are presented in Table 1-2.

Example 5

<Production of Anisotropic Conductive Film and Bonded Structure>

Anisotropic Conductive Film 7 and Bonded Structure 7 were obtained in the same manner as in Example 1, provided that, in the production of the conductive particles, the Ni—P plating was replaced with Co plating.

Note that, the average thickness of the plated layer was 100 nm. Moreover, whether or not each of the resin particles each provided with the metal plated layer were covered with the insulating layer was confirmed by observing the particles under the metallurgical microscope.

Anisotropic Conductive Film 7 and Bonded Structure 7 as obtained were subjected to the evaluations in the same manner as in Comparative Example 1. The results are presented in Table 1-2.

Example 6

<Production of Anisotropic Conductive Film and Bonded Structure>

Anisotropic Conductive Film 8, and Bonded Structure 8 were obtained in the same manner as in Example 1, provided that the resin particles to each of which the metal plated layer had been provided, were replaced with nickel particles (product name: T123, manufactured by Inco Limited, average particle diameter: 3 μm).

Whether or not each of the nickel particles were covered with the insulating layer was confirmed by observing the particles under the metallurgical microscope.

Anisotropic Conductive Film 8 and Bonded Structure 8 as obtained were subjected to the evaluations in the same manner as in Comparative Example 1. The results are presented in Table 1-2.

Comparative Examples 3 and 4

<Production of Anisotropic Conductive Film and Bonded Structure>

Anisotropic Conductive Films 9 to 10, and Bonded Structures 9 to 10 were obtained in the same manner as in Example 1, provided that the average particle number of the linkage of the conductive particles in the anisotropic conductive film was changed as depicted in Table 1-2 by adjusting the conditions of the magnetizing.

Anisotropic Conductive Film s 9 to 10 and Bonded Structure 9 to 10 as obtained were subjected to the evaluations in the same manner as in Comparative Example 1. The results are presented in Table 1-2.

Example 7

<Production of Anisotropic Conductive Film and Bonded Structure>

Anisotropic Conductive Film 11 and Bonded Structure 11 were obtained in the same manner as in Example 1, provided that the average particle number of the linkage of the conductive particles in the anisotropic conductive film was changed as depicted in Table 1-2 by adjusting the conditions of the magnetizing.

Anisotropic Conductive Film 11 and Bonded Structure 11 as obtained were subjected to the evaluations in the same manner as in Comparative Example 1. The results are presented in Table 1-2.

TABLE 1-1

| | | | Comp. Ex. 1 | Comp. Ex. 2 | Ex. 1 | Ex. 2 | Ex. 3 |
|---|---|---|---|---|---|---|---|
| Conductive particles | Conductive core material | plating | Au | Ni—P | Ni—P | Ni—P | Ni—P |
| | | P/B concentration | 9.5 | 9.5 | 3.3 | 9.5 | 11.9 |
| | | Presence of insulating layer | None | None | Present | Present | Present |
| | | Average particle diameter (μm) | 3 | 3 | 3 | 3 | 3 |
| Particle concentration (pcs./mm²) | | | 4,000 | 4,000 | 4,000 | 4,000 | 4,000 |
| Average paticle number of linkage (number) | | | 2.1 | 3.6 | 4.1 | 3.7 | 3.0 |
| Particle linking rate (%) | | | 2 | 31 | 49 | 30 | 8 |
| Number of captured particles (pcs.) | | Max. | 20 | 33 | 41 | 32 | 21 |
| | | Min. | 2 | 8 | 7 | 9 | 3 |
| | | Ave. | 18 | 22 | 23 | 23 | 13 |
| Particle capturing efficiency rate (%) | | | 20 | 35 | 36 | 36 | 20 |
| Resistance (Ω) | | Max. | 10.5 | 2.1 | 2.1 | 2.1 | 11.5 |
| | | Min. | 1.2 | 1.2 | 1.2 | 1.2 | 2.2 |
| | | Ave. | 2.0 | 1.6 | 1.6 | 1.6 | 2.9 |
| Occurrence of short circuit (number) | | | 3 | 18 | 0 | 0 | 0 |

TABLE 1-2

| | | | Ex. 4 | Ex. 5 | Ex. 6 | Comp. Ex. 3 | Comp. Ex. 4 | Ex. 7 |
|---|---|---|---|---|---|---|---|---|
| Conductive particles | Conductive core material | plating | Ni—B | Co | — | Ni—P | Ni—P | Ni—P |
| | | P/B concentration | 5.5 | — | — | 3.3 | 3.3 | 3.3 |
| | | Presence of insulating layer | Present | Present | Present | Present | Present | Present |
| | | Average particle diameter (μm) | 3 | 3 | 3 | 3 | 3 | 3 |
| Particle concentration (pcs./mm²) | | | 4,000 | 4,000 | 4,000 | 4,000 | 4,000 | 4,000 |
| Average particle number of linkage (number) | | | 4.3 | 3.8 | 3.1 | 2.1 | 10.8 | 9.1 |
| Particle linking rate (%) | | | 49 | 39 | 14 | 2 | 86 | 77 |
| Number of captured particles (pcs.) | | Max. | 40 | 37 | 20 | 20 | 52 | 46 |
| | | Min. | 10 | 8 | 3 | 2 | 18 | 13 |
| | | Ave. | 22 | 18 | 15 | 12 | 26 | 25 |
| Particle capturing efficiency rate (%) | | | 35 | 28 | 21 | 19 | 40 | 38 |
| Resistance (Ω) | | Max. | 2.1 | 3.3 | 6.6 | 6.4 | 65.8 | 9.8 |
| | | Min. | 1.2 | 1.8 | 1.9 | 1.3 | 1.4 | 1.2 |
| | | Ave. | 1.6 | 2.3 | 3.8 | 3.2 | 49.9 | 3.6 |
| Occurrence of short circuit (number) | | | 0 | 0 | 0 | 0 | 26 | 0 |

In Tables 1-1 and 1-2, the term "P/B concentration" means a concentration of phosphorus or boron in a plated layer, and a unit thereof is % by mass.

In Comparative Example 1, Au plating was performed. Therefore, magneticity was weak to thereby give a low particle linking rate. As the conductive particles each of which did not have an insulating layer were used, moreover, a short circuit occurred. In Comparative Example 2, Ni—P plating was performed. Therefore, a particle linking rate was desirable due to the magneticity of Ni. As the conductive particles each of which did not have an insulating layer were used, however, a large number of short circuits occurred. Accordingly, in a case where conductive particles without an insulating layer were used, the number of short circuit occurred increased as the particle linking rate became high.

In Examples 1 to 7, on the other hand, excellent particle capturing rate and conduction resistance were achieved, and occurrence of short circuit was not observed. Examples 1 to 3 were examples where a concentration of P in the Ni—P plating was varied. As the concentration of P was lower, the magneticity became stronger, and the particle linking rate became higher.

Moreover, in Examples 1 to 2, Examples 4 to 5, and Example 7, the particle linking rate was within the desirable range. Therefore, the further desirable particle capturing rate was achieved.

As the average number of the linked conductive particles was less than 3.0 in Comparative Example 3, the particle capturing rate (particle capturing efficiency rate) was less than 20%, which was insufficient.

As the average number of the linked conductive particles was greater than 10.0 in Comparative Example 4, conduction resistance was high to cause a conduction failure, and a large number of short circuit also occurred.

INDUSTRIAL APPLICABILITY

The anisotropic conductive film and connection method of the present invention can achieve anisotropic conductive connection having excellent conduction resistance and particle capturing rate, with attaining insulating resistance between adjacent terminals, and thus can suitably be used for production of a bonded structure through anisotropic conductive connection of fine-pitch.

What is claimed is:

1. An anisotropic conductive film, comprising:
   conductive particles,
   wherein the anisotropic conductive film is an anisotropic conductive film configured to anisotropic conductively connect a terminal of a substrate with a terminal of an electronic component,
   wherein the conductive particles are (i) conductive particles, in each of which a metal plated layer and an insulating layer are sequentially provided on a surface of a resin particle, or (ii) conductive particles, in each of which an insulating layer is provided on a metal particle, or (iii) both the (i) conductive particles and the (ii) conductive particles,
   wherein an average particle number of linkage of the conductive particles is 3.0 to 10.0, the linkage of the conductive particles being a state that the conductive particles are in direct physical contact with each other, and
   wherein a particle linking rate of the conductive particles is 8% to 39%.

2. The anisotropic conductive film according to claim 1, wherein the metal plated layer is a magnetic metal plated layer containing at least one selected from the group consisting of Fe, Ni, and Co.

3. The anisotropic conductive film according to claim 1, wherein the metal particle is a nickel particle.

4. The anisotropic conductive film according to claim 1, wherein an average particle number of linkage of the conductive particles is 3.0 to 5.0, the linkage of the conductive particles being a state that the conductive particles are in direct physical contact with each other.

5. A method for producing an anisotropic conductive film, comprising:
   magnetizing conductive particles having magnetism contained in an anisotropic conductive composition; and
   applying the anisotropic conductive composition containing the magnetized conductive particles onto a base,
   wherein the anisotropic conductive film contains the conductive particles,
   wherein the conductive particles are (i) conductive particles, in each of which a metal plated layer and an insulating layer are sequentially provided on a surface of a resin particle, or (ii) conductive particles, in each of which an insulating layer is provided on a metal particle, or (iii) both the (i) conductive particles and the (ii) conductive particles,
   wherein an average particle number of linkage of the conductive particles is 3.0 to 10.0, the linkage of the conductive particles being a state that the conductive particles are in direct physical contact with each other, and
   wherein a particle linking rate of the conductive particles is 8% to 39%.

6. The method according to claim 5, wherein the metal plated layer is a magnetic metal plated layer containing at least one selected from the group consisting of Fe, Ni, and Co.

7. The method according to claim 5, wherein the metal particle is a nickel particle.

8. The method according to claim 5, wherein an average particle number of linkage of the conductive particles is 3.0 to 5.0, the linkage of the conductive particles being a state that the conductive particles are in direct physical contact with each other.

9. A method for anisotropic conductively connecting a terminal of a substrate and a terminal of an electronic component, comprising:
   adhering an anisotropic conductive film on the terminal of the substrate;
   mounting the electronic component on the anisotropic conductive film; and
   heating and pressing the electronic component with a heat-press member,
   wherein the anisotropic conductive film contains conductive particles,
   wherein the conductive particles are (i) conductive particles, in each of which a metal plated layer and an insulating layer are sequentially provided on a surface of a resin particle, or (ii) conductive particles, in each of which an insulating layer is provided on a metal particle, or (iii) both the (i) conductive particles and the (ii) conductive particles,
   wherein an average particle number of linkage of the conductive particles is 3.0 to 10.0, the linkage of the conductive particles being a state that the conductive particles are in direct physical contact with each other, and wherein a particle linking rate of the conductive particles is 8% to 39%.

10. The method according to claim 9, wherein the metal plated layer is a magnetic metal plated layer containing at least one selected from the group consisting of Fe, Ni, and Co.

11. The method according to claim 9, wherein the metal particle is a nickel particle.

12. The method according to claim 9, wherein an average particle number of linkage of the conductive particles is 3.0 to 5.0, the linkage of the conductive particles being a state that the conductive particles are in direct physical contact with each other.

13. A bonded structure, obtained by a method for anisotropic conductively connecting a terminal of a substrate and a terminal of an electronic component, the method comprising:

adhering an anisotropic conductive film on the terminal of the substrate;

mounting the electronic component on the anisotropic conductive film; and heating and pressing the electronic component with a heat-press member, wherein the anisotropic conductive film contains conductive particles, wherein the conductive particles are (i) conductive particles, in each of which a metal plated layer and an insulating layer are sequentially provided on a surface of a resin particle, or (ii) conductive particles, in each of which an insulating layer is provided on a metal particle, or (iii) both the (i) conductive particles and the (ii) conductive particles, wherein an average particle number of linkage of the conductive particles is 3.0 to 10.0, the linkage of the conductive particles being a state that the conductive particles are in direct physical contact with each other, and wherein a particle linking rate of the conductive particles is 8% to 39%.

14. The bonded structure according to claim 13, wherein the metal plated layer is a magnetic metal plated layer containing at least one selected from the group consisting of Fe, Ni, and Co.

15. The bonded structure according to claim 13, wherein the metal particle is a nickel particle.

16. The bonded structure according to claim 13, wherein an average particle number of linkage of the conductive particles is 3.0 to 5.0, the linkage of the conductive particles being a state that the conductive particles are in direct physical contact with each other.

* * * * *